United States Patent [19]

Yamazaki et al.

[11] Patent Number: 5,559,347

[45] Date of Patent: *Sep. 24, 1996

[54] INSULATED GATE-TYPE BIPOLAR TRANSISTOR

[75] Inventors: Tomoyuki Yamazaki; Masahito Otsuki, both of Nagano, Japan

[73] Assignee: Fuji Electronic Co., Ltd., Tokyo, Japan

[ * ] Notice: The term of this patent shall not extend beyond the expiration date of Pat. No. 5,530,277.

[21] Appl. No.: 397,418

[22] Filed: Mar. 1, 1995

[30] Foreign Application Priority Data

Mar. 1, 1994 [JP] Japan ................... 6-030723

[51] Int. Cl.$^6$ ........................... H01L 29/74; H01L 29/76
[52] U.S. Cl. ........................ 257/139; 257/341; 361/56
[58] Field of Search ..................... 257/341, 139; 361/56

[56] References Cited

U.S. PATENT DOCUMENTS

| | | | |
|---|---|---|---|
| 4,642,674 | 2/1987 | Schoofs | 357/23.8 |
| 5,303,110 | 4/1994 | Kumagai | 361/18 |
| 5,341,003 | 8/1994 | Obinata | 257/378 |

FOREIGN PATENT DOCUMENTS

| | | |
|---|---|---|
| 0132861 | 2/1985 | European Pat. Off. . |
| 4209148 | 10/1992 | Germany . |
| 4-5864 | 1/1992 | Japan . |
| 5-95118 | 4/1993 | Japan . |

Primary Examiner—Mark V. Prenty
Attorney, Agent, or Firm—Brumbaugh, Graves, Donohue & Raymond

[57] ABSTRACT

An insulated gate-type bipolar transistor with an overcurrent limiting function that is capable of keeping the ratio of a main current to a detection current constant even under different operating conditions, and capable of suppressing the voltage dependence of the limited-current value to perform stable overcurrent protection. P-wells are formed so that they are incorporated between main cell IGBTs as sensing cells for current detection on part of the semiconductor substrate on which a large number of main cells are formed integratedly, and current-detecting emitter electrodes connected to the P-wells are connected to an overcurrent-protection circuit and separated from the main emitter electrodes connected to the main IGBT cells. Given such a configuration, the overcurrent flowing into the main cells during a load short circuit in an inverter device is detected as a hole current from the P-wells with a high accuracy of keeping the current ratio to the current in the main cells constant, and moreover, stable overcurrent protection is performed keeping the limited current values suppressed below the short-circuit withstand capability without dependence on the power supply voltage.

6 Claims, 3 Drawing Sheets

1

INSULATED GATE-TYPE BIPOLAR TRANSISTOR

FIELD OF THE INVENTION

The present invention relates to an insulated gate-type bipolar transistor (IGBT) acting as a power-switching device that is applied to inverters and other similar devices.

BACKGROUND OF THE INVENTION

An insulated gate-type bipolar transistor (hereinafter referred to as IGBT) is a voltage-driven semiconductor switching device capable of a high-speed turning-off operation with relatively low voltage application, which is used widely in the power-electronics field in for example, inverters and other similar devices.

An IGBT output-type inverter device may have an overcurrent flow into the IGBT if there is an inrush current when a motor is actuated, and failures such as a load short circuit and arm short circuit occur. Hence, superior electrical characteristics are required for the IGBT to protect against a high voltage and large current input. One important electric characteristic is the capacity to withstand breakdown known as short-circuit withstand capability.

In accordance with this need for short-circuit protection, the inverter device incorporates a protection circuit to detect short-circuit failures when they occur resulting in turning the power supply off. However, this protection circuit requires 10 to 20 μsec to detect the overcurrent and engage its protective function. The IGBT must not break down due to the overcurrent during this period.

Therefore, many recent high-performance IGBT modules adopt an overcurrent-protection system disposed independently of the protection circuit in the inverter device, which can detect at a high speed an overcurrent flowing into the IGBT when a short-circuit failure occurs, and which can limit the current flowing in the IGBT to be within the short-circuit withstand capability of the IGBT. The overcurrent protection system operates by means of a gate control operated based on an overcurrent detection signal before the power supply is turned off by the first protection circuit.

FIG. 6 shows a prior art IGBT independent overcurrent-protection circuit according to the over-current protection system. The circuit includes a main element 1 (IGBT), a current-detection sub-element 2 (different IGBT from the main element 1) connected in parallel to the main element 1, a current-detection resistance 3 connected in series to the sub-element 2, and a switching element (MOSFET) 4 connected to the gate-driving circuits. The main element 1 and the sub-element 2 perform on-off operations according to the voltage generated across the current-detection resistance 3.

Given such a configuration, when an overcurrent due to load short-circuit failure or the like flows into the main element 1 and the sub-element 2 and causes the voltage drop generated between both ends of the current-detection resistance 3 to exceed the threshold voltage of the switching element 4, the switching element 4 turns on to reduce the gate voltage to both the main element 1 and the current-detection sub-element 2 thus limiting the main current flowing in the IGBT main element 1. Thus, the main current flowing in the IGBT main element 1 can be suppressed to be within the short-circuit withstand capability of the IGBT element 1 by means of adequately setting the resistance of the current-detection resistance 3 and the threshold voltage of the switching element 4.

When an overcurrent-protection circuit that includes the IGBT sub-element 2 for current detection is constructed as an external, independent circuit to protect the IGBT main element 1 as described above in connection with the second protection circuit, it is technically difficult to maintain the operational characteristics of the main element 1 proportional to those of the sub-element 2. In other words, since the short-circuit phenomena in an inverter includes various modes such as an arm short circuit, series short circuit, output short circuit and ground fault, and it is anticipated that the collector-to-emitter voltage VCE applied to the IGBT element 1 to be protected will vary according to the short-circuit mode. This may cause the current ratio between the main element 1 and the sub-element 2 to vary, and may therefore vary the limited-current value if the collector-to-emitter voltage VCE varies as described above, making a stable overcurrent-protection operation difficult.

To solve the above problem, a configuration has already been proposed by the same applicant of the present invention in Japanese patent application No. 5-256197, wherein some of the cells formed integratedly on a semiconductor substrate are used as sensing cells to detect the current in the IGBT main element 1, and the emitter electrodes of the sensing cells are laid out separately from the emitter electrodes of the main cells formed on the same substrate and connected to a current-detection resistance in an overcurrent-protection circuit.

In the construction that incorporates the main cells of the IGBT and the current detection sensing cells of the IGBT on the same semiconductor substrate as described above, the gate electric potential of the sensing cell may change with a voltage drop at the current-detection resistance of the overcurrent-protection circuit which is connected to the sensing cells, depending on the position of the sensing cells and the IGBT output characteristics. The change in the gate electric potential generates a difference in the current density between the main cells and the sensing cells causing the current ratio to vary. Experimental results have shown that the change thereof in the collector-to-emitter voltage VCE due to the current ratio variation causes the limited-current values to change. In particular the limited-current values increase in a low voltage region in which the collector-to-emitter voltage VCE is low.

Moreover, if the voltage dependence of the limited-current values increases, trouble may occur in the overcurrent-protection operations if the IGBT is applied to an inverter device. Hence, it is necessary to suppress the voltage dependence of the limited-current values, keeping it as low as possible.

SUMMARY OF THE INVENTION

The present invention is intended to solve the above problems, and thereby provides an insulated gate-type bipolar transistor with an overcurrent-limiting function that is capable of keeping the ratio of the main current to the detection current constant even in different operating environments, while suppressing the voltage dependence of the limited-current values to ensure reliable overcurrent protection.

According to the present invention, an insulated gate-type bipolar transistor has current-detection sensing cells formed in part of the semiconductor substrate on which a large number of main cells are formed integratedly, and the emitter electrodes of the sensing cells are separated from the emitter electrodes of the main cells and are connected to an overcurrent protection circuit, wherein the sensing cells are formed by means of P-wells, and are laid out in the vicinity of the main cell region.

In the above configuration, the P-wells connected to the emitter electrodes of the sensing cells may be formed in such a way that they are incorporated between the main cells, preferably setting the distance between the P-wells and the adjoining main cells to 10 µm or less.

In the above configuration, the P-wells that form the sensing cells to detect the current are positioned in the active region of the main cells on the same semiconductor substrate, and a current proportional to the hole current flowing in the main cells is extracted via the P-wells during the IGBT voltage-on period, and is detected with high accuracy by a current-detection resistance in the overcurrent-protection circuit connected to the emitter electrodes of the sensing cells. In the case in which an overcurrent flows because of a load short circuit or other similar phenomenon, the gate voltage of the main cells is reduced by operation of the protection circuit to limit the main current to within the short-circuit withstand capability of the IGBT, thereby protecting the cells from a breakdown.

Additionally, forming the sensing cells by means of the P-wells in this case eliminates the change in the current ratio between the main cells and the sensing cells, which occurs when an IGBT is used for the sensing cells, and the voltage dependence of the limited-current values caused by the change in this current ratio is well suppressed. Furthermore, by laying out the P-wells connected to the emitter electrodes of the sensing cells so that they are incorporated in narrow clearances between the main cells, the linearity of the current in the sensing cells to the hole current in the adjoining main cells can be ensured resulting to greatly improve accuracy in detecting the main current.

BRIEF DESCRIPTION OF THE DRAWINGS

Further objects, features and advantages of the invention will become apparent from the following detailed description taken in conjunction with the accompanying figures showing a preferred embodiment of the invention, on which:

FIG. 2 is an expanded view of sensing cells in the chip in FIG. 1a;

DETAILED DESCRIPTION OF THE PREFERRED EMBODIMENTS

Figure 1A:
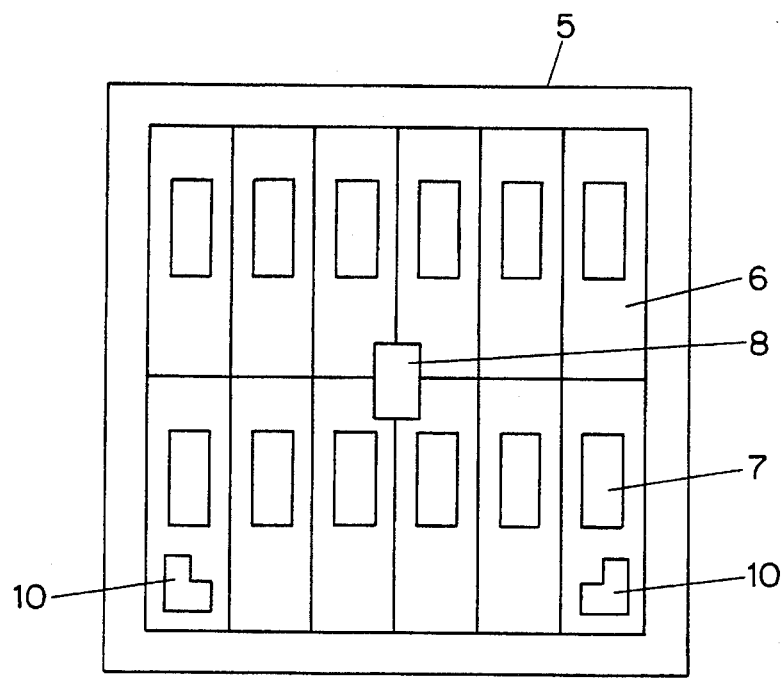
FIG. 1a is plan view of the configuration of the insulated gate-type bipolar transistor chip in accordance with the present invention.
Figure 1B:
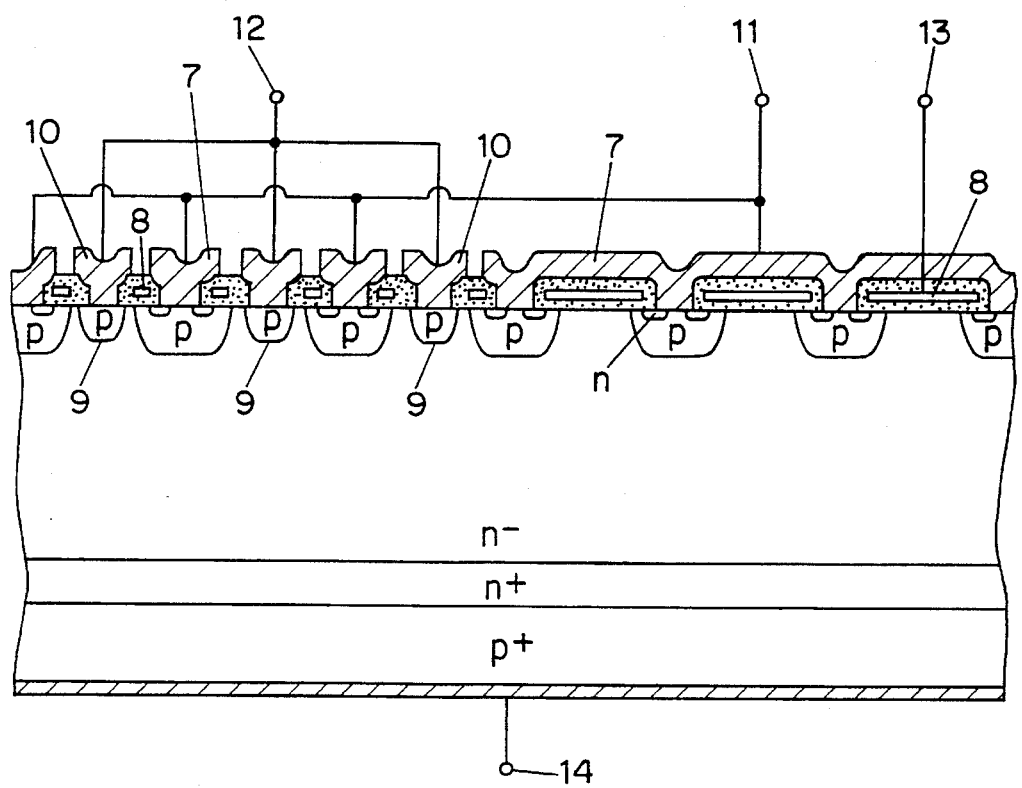
FIG. 1b is a cross-sectional view of IGBTs formed in a chip in accordance with the present invention.
Figure 2:
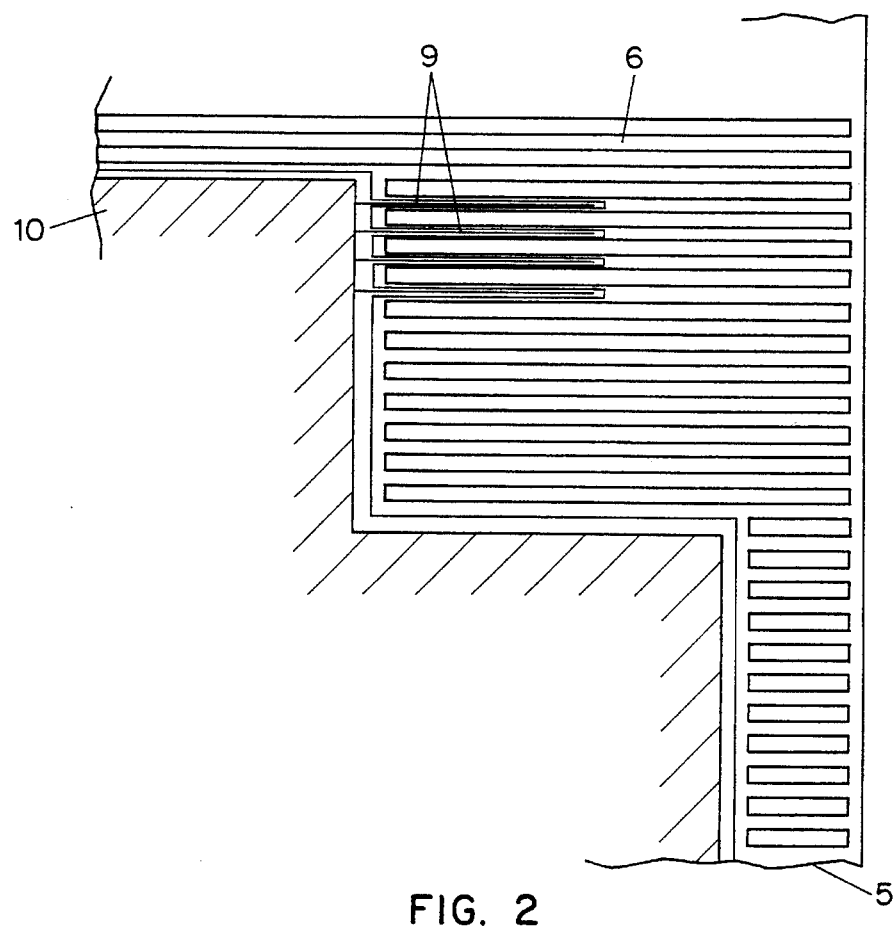

FIGS. 1a and 1b are a plan view of an IGBT chip and a cross-sectional view of a cell, respectively, and FIG. 2 is an expanded view of the sensing cells in FIGS. 1a and 1b. Referring to FIG. 1a, the semiconductor substrate 5 has a large number of n-channel type IGBTs (part of the main cells) 6 which are parallel to each other in stripes, and the main emitter electrodes 7 and the gate electrodes 8 are formed for each IGBT 6 of the main cells. In addition, the current-detection sensing cells as described below are incorporated in the corners of the semiconductor substrate 5.

Referring to FIG. 1b, each sensing cell consists of diffusion-formed P-wells 9 which are inserted like comb teeth between the stripes of p-base layers of the main cell IGBTs 6 and the emitter electrodes 10 for current detection connected to the P-wells 9, which are separated from the emitter electrodes 7 of the main cells as shown in FIG. 1b and FIG. 2. In this case, the IGBTs 6 of the main cells and the P-wells 9 running parallel therewith may be better arranged in proximity to each other with the distance between them set to 10 µm or less, though this depends on the resistivity of the semiconductor substrate 5. In addition, the gate electrode 8 of the main cells is divided at the part where the emitter electrodes 10 are taken out from the P-wells 9, as shown in FIG. 1b.

Furthermore, FIG. 1b shows a main emitter terminal 11, a current-detection emitter terminal 12, a gate terminal 13, and a collector terminal 14. The current-detection emitter terminal 12 is connected to the current-detection resistance 3 in the overcurrent-protection circuit in the way shown in FIG. 6. The current-detection resistance 3 and the sub-element MOSFET 4 that constitute the overcurrent-detection circuit may be constructed as an external circuit separated from the IGBTs, or formed around the gate electrode on said semiconductor substrate 5.

Figure 3:
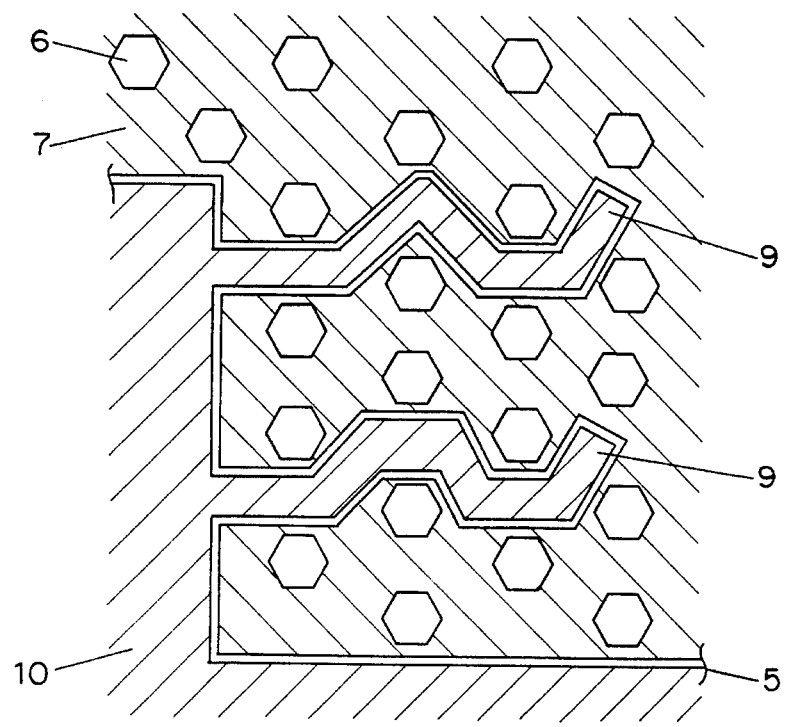
FIG. 3 is an expanded view of sensing cells in a chip in accordance with an applied embodiment of the present invention.

FIG. 3 shows an applied embodiment where the IGBTs 6 of the main cells are distributed like an archipelago. In this embodiment, the P-wells 9 of the sensing cells run zigzag between the main cells.

Figure 6:
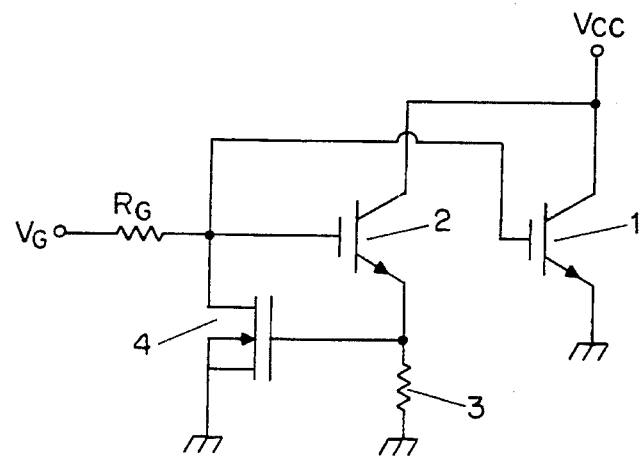
FIG. 6 is a diagram of a prior art overcurrent-protection circuit in an IGBT.

The overcurrent-protection operation of the IGBT 6 according to the construction in FIG. 3 is nearly the same as what is illustrated in FIG. 6. The overcurrent flowing in the main cell IGBT 6 is detected as a hole current by means of the P-wells 9 of the current-detection sensing cells formed on the same semiconductor substrate 5, and the detected current is fed back to the overcurrent-protection circuit which then reduces the gate voltage so that the overcurrent is restricted to within the short-circuit withstand capability. In addition, because the P-wells 9 for the sensing cells are arranged in close proximity to the active region of the main cell IGBT 6, the on-state voltage for this main cell is higher than that for the other main cells. Hence, no current concentration occurs in this area. Furthermore, since latch up phenomenon is prevented as a result of forming the sensing cells with P-wells, the turn-off failure due to current concentration in this area can be prevented.

Figure 4:
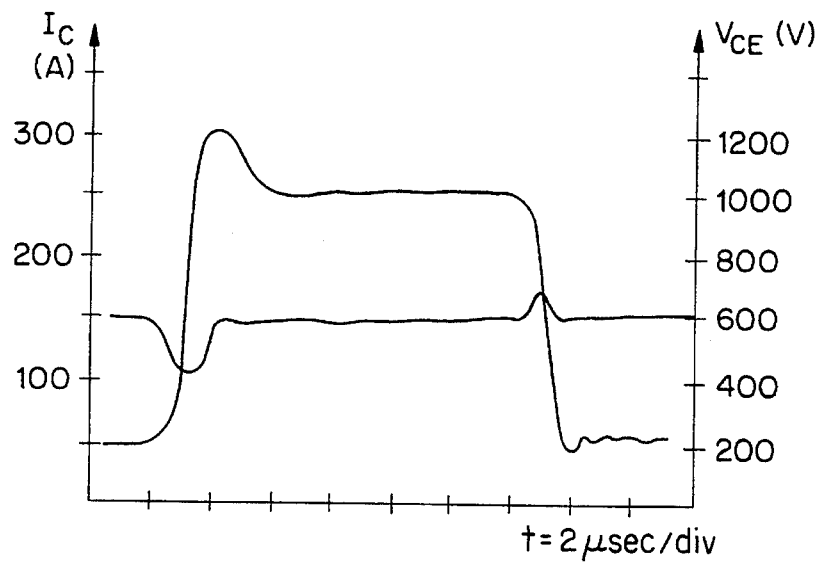
FIG. 4 is a voltage and current waveform chart observed in a load short-circuit test performed by connecting a protection circuit to the IGBT in FIGS. 1a and 1b.

FIG. 4 shows the waveforms of the main current Ic and the voltage VCE observed in a short-circuit test using the overcurrent-protection circuit connected to the IGBT with the configuration described in FIG. 3 (with a withstand voltage of 600 V, and a rated current of 100 A) and using a power supply voltage of 400 V. As can be seen from this waveform graph, the main current in the IGBT is reduced in a period of a few microseconds so that the limited-current value relative to the rated current of 100 A is within the short-circuit withstand capability of 250 A.

Figure 5:
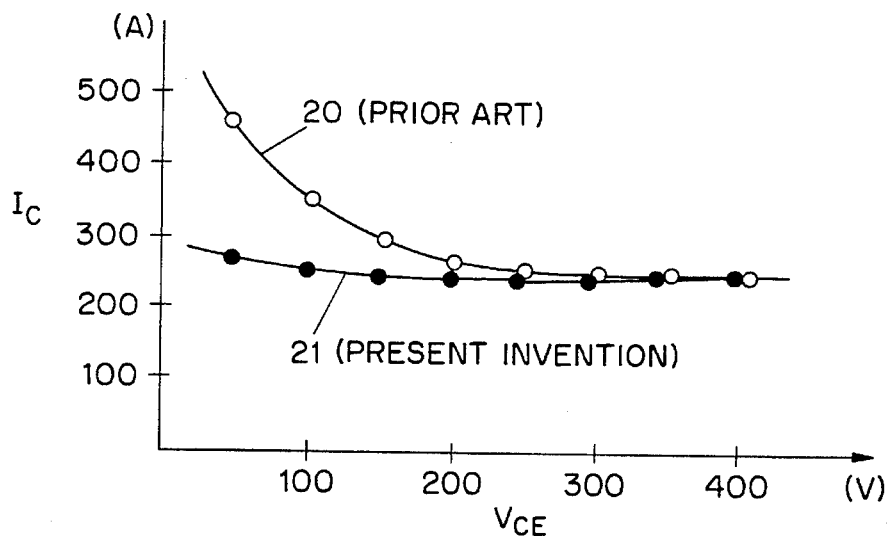
FIG. 5 is a characteristics graph illustrating the relationship between the power supply voltage and the limited-current value by comparing an embodiment of the present invention with the prior art.

FIG. 5 is a characteristics graph that illustrates the limited-current values of an overcurrent when the power supply voltage applied across the collector and the emitter changes in order to compare the embodiment of the present invention with a conventional system (a system using an IGBT as a sensing cell). The tested IGBT shown in this graph is an element with a large gain. The prior art applied to this type of element shows a trend in which the limited-current value increases in a low voltage region as shown by characteristics line 20, while in the present invention the limited-current value changes very little and remains the same from a high voltage region to low voltage region as shown by characteristics line 21. This means that the voltage dependence of the limited-current value is greatly reduced. This effect stabilizes overcurrent protection when the IGBT is used in the inverter device regardless of the short-circuit mode that may take place.

As described above, the insulated gate-type bipolar transistor according to the present invention, characterized in that sensing cells for current detection are formed on part of a semiconductor substrate with a large number of main cells that are formed integratedly, the emitter electrodes of said sensing cells are laid out separately from the emitter electrodes of the main cells and are connected to an overcurrent-protection circuit, an overcurrent that flows into the main cells due to a load short circuit in an inverter device is detected as a hole current with high accuracy from P-wells while the current ratio between the main cells and the sensing cells is maintained constant because of a construction in which said sensing cells are formed by means of the P-wells and laid out in the vicinity of the main cell region. As a result, the limited-current value is suppressed to within the short-circuit withstand capability without dependence on the power supply voltage because of said construction, which in turn makes stable overcurrent protection possible.

Furthermore, by forming the P-wells connected to the emitter electrodes of the sensing cells by incorporating them between the main cells, and by setting the distance between the P-wells and the adjoining main cells to 10 µm or less, linearity of the sensing cell current to the hole current in the main cells is ensured, thereby further improving the current detection accuracy.

The foregoing merely illustrates the principles of the invention. It will thus be appreciated that those skilled in the art will be able to devise numerous systems and methods which, although not explicitly shown or described herein, embody the principles of the invention and are thus within the spirit and scope of the invention.

We claim:

1. An insulating gate-type bipolar transistor with overcurrent protection comprising:

a main cell formed from a semiconductor substrate, including first emitter electrode;

a sensing cell formed from said semiconductor substrate comprising a P-well located near said main cell, wherein said sensing cell includes a second emitter electrode; and an overcurrent protection circuit responsive to said second emitter electrode for limiting said current to said main cell, wherein said main cell and said sensing cell are physically separated and said second emitter electrode is connected to said overcurrent protection current.

2. The insulated gate-type bipolar transistor of claim 1, wherein said semiconductor substrate includes a plurality of main cells and said P-well is located in close proximity between said main cells.

3. The insulated gate-type bipolar transistor of claim 1, where said P-well is located at least approximately within 10 µm of said main cell.

4. The insulated gate-type bipolar transistor of claim 2, where said P-well is located at least approximately within 10 µm of said main cells.

5. The insulated gate-type bipolar transistor of claim 1, wherein said overcurrent protection circuit includes a switching means responsive to the voltage across a resistance means coupled to said sensing cell, wherein said switching means is coupled to said main cell.

6. An insulating gate-type bipolar transistor with overcurrent protection comprising:

a main cell formed from a semiconductor substrate, including first emitter electrode;

a sensing cell formed from said semiconductor substrate comprising a P-well located near said main cell, wherein said sensing cell includes a second emitter electrode; and an overcurrent protection circuit responsive to said second emitter electrode for limiting said current to said main cell, wherein said first and second electrodes are physically separated and said second emitter electrode is connected to said overcurrent protection current and said overcurrent protection circuit includes a switching means responsive to the voltage across a resistance means coupled to said sensing cell, wherein said switching means is coupled to said main cell.

* * * * *

UNITED STATES PATENT AND TRADEMARK OFFICE
CERTIFICATE OF CORRECTION

PATENT NO. : 5,559,347
DATED : September 24, 1996
INVENTOR(S) : Yamazaki et al.

It is certified that error appears in the above-identified patent and that said Letters Patent is hereby corrected as shown below:

Title Page, Item 73, "Electronic" should read --Electric--.

Signed and Sealed this

Twenty-fifth Day of March, 1997

Attest:

BRUCE LEHMAN

Attesting Officer          Commissioner of Patents and Trademarks